United States Patent [19]

Koike

[11] Patent Number: 4,857,428
[45] Date of Patent: Aug. 15, 1989

[54] METHOD FOR FORMING LIGHT ABSORBING PATTERN USING PHOTORESIST COMPOSITION ON PHOSPHOR SCREENS OF COLOR PICTURE TUBES WHEREIN COMPOSITION INCLUDES AZIDE COMPOUND AND DIAZO FORMALDEHYDE PHOSPHATE

[75] Inventor: Norio Koike, Fukaya, Japan

[73] Assignee: Kabushiki Kaisha Toshiba, Kawasaki, Japan

[21] Appl. No.: 143,718

[22] Filed: Jan. 14, 1988

[30] Foreign Application Priority Data

Jan. 22, 1987 [JP] Japan .................... 62-11255

[51] Int. Cl.$^4$ .......................... G03C 5/00; H01J 9/20
[52] U.S. Cl. ..................................... 430/25; 430/23; 430/28; 430/175; 430/194; 430/197
[58] Field of Search ............. 430/25, 23, 28, 175, 430/194, 197

[56] References Cited

U.S. PATENT DOCUMENTS 3,917,794  11/1975  Akagi et al. ................. 430/25
4,491,629  1/1985   Koike et al. ................. 430/176
4,596,755  6/1986   Koike et al. ................. 430/196

OTHER PUBLICATIONS

Derwent Abstract of Japanese Published Patent 83-057094-B, 12/1983.
English Translation of Japanese Kokai Publication #60-203,933, published 10/15/85, (Isozato, Koike & Watanabe).
English Translation of Japanes Kokai Publication #58-57094, published 12/19/83, (Kobayashi, Nonogaki & Hatano).

Primary Examiner—Charles L. Bowers, Jr.
Attorney, Agent, or Firm—Oblon, Spivak, McClelland, Maier & Neustadt

[57] ABSTRACT

A photoresist film containing a phosphate of a formalin condensate of diazodiphenylamine, 2.5-bis (4'-azide-2'-sulphobenzilidene) cyclopentanone Na, polyvinylalcohol, and polyvinylpyrrolidone is formed on the inner surface of a faceplate. The photoresist film is hardened by light exposure using a point or linear light source, which is essentially a circular light source, via a shadow mask having a large number of apertures. A light absorbing film is formed on this photoresist film. Then the hardened photoresist film and the light absorbing film on top of it are removed using a peeling agent.

3 Claims, 1 Drawing Sheet

METHOD FOR FORMING LIGHT ABSORBING PATTERN USING PHOTORESIST COMPOSITION ON PHOSPHOR SCREENS OF COLOR PICTURE TUBES WHEREIN COMPOSITION INCLUDES AZIDE COMPOUND AND DIAZO FORMALDEHYDE PHOSPHATE

BACKGROUND OF THE INVENTION

This invention relates to color picture tubes, and more particularly, to a formation method for a high-definition phosphor screen, and a photoresist composition with improved sensitivity and resolution for low illuminance exposure used in the method.

Normally, the phosphor screen of a color picture tube has phosphor layers of dots or stripes which emit red, green and blue light, and light absorbing layers which are provided between these phosphor layers.

Generally, the pattern of these light absorbing layers is formed by a method such as the following. First, a photosensitive resin liquid is thinly coated on the inner surface of the faceplate of the picture tube. This coating is then dried into a resin film. Next, the resin film is exposed by the light from a dotted or linear light source through a shadow mask with a plurality of round or rectangular apertures. The exposed portions of the resin film are light-hardened into an insoluble photoresist layer, while the unexposed portions remain unhardened by the light.

In order to generate light loci on the resin film approximating positions corresponding to the electron beam loci from an electron gun of a color picture tube, the light source is set in a position corresponding to the deflection centre of the electron gun. Moreover, a correction lens, which is normally composed of glass or transparent plastic, is provided between the light source and the shadow mask.

After this, the resin film is developed by a warm water spray. The unexposed resin film is removed by the spray and the corresponding portions of the inner surface of the faceplate are revealed.

In this condition, a slurry containing a light absorbing black material, such as graphite, next is coated on the inner surface of the faceplate. After this, the slurry is dried and forms a light absorbing film. Then, this film is placed in contact with a peeling agent. At this time, the light-hardened resin swells and becomes brittle due to this peeling agent. After this, when another warm water spray treatment is carried out, the brittle resin film and the light absorbing film on top of it are removed and the inner surface of the faceplate in those portions is revealed, while the other portions of the light absorbing film remain as they are. Thus, a dotted or striped black matrix is formed.

In recent years, the uses of color picture tubes have rapidly expanded to include OA equipment terminals, such as microcomputers, in addition to conventional use in televisions. In these applications, compared with the past, a high-definition phosphor screen is required. The actual dimensions vary depending on the size of the color picture tube. For instance, in the case of a 14-inch screen, whereas the hall pitch was (distance between adjacent dots) 0.6 mm in the past, it is now 0.2 mm in the case of a high-definition screen, and the dimensions are three times more highly defined. In order to accomplish this requirement, a photoresist composition which contains a sodium salt of 4.4'-bisazidestilbene-2.2'-disulphonic acid, polyvinylpyrrolidone and N-β(aminoethyl) γ-aminopropyltrimethoxysilane as an adhesion accelerator (coupling agent), such as is disclosed in U.S. Pat. No. 3,917,794, has come into use.

On the other hand, the illuminance on the photoresist surface is greatly reduced during manufacture of this type of high-definition phosphor screen, because the photoresist is exposed by a light from a light source with a window of small diameter through a smaller aperture shadow mask to correspond to the higher definition. In the case of the above-mentioned 14-inch screen color picture tube, if the same 1 KW light source is used, the illuminance at the photoresist surface will be reduced to less than 10% of that in a conventional case. For example, exposure illuminance at the surface of the photoresist film for a conventional phosphor screen with a hole pitch of 0.6 mm is 1.7 mw/cm$^2$, but exposure illuminance at the surface of the photoresist film for a high-definition phosphor screen with a hole pitch of 0.2 mm is 0.13 mw/cm$^2$. Thus, if the exposure time was increased by 10 times in comparison to conventional processing in order to obtain the same amount of exposure, one would expect that the same shape of pattern could be obtained. However, in fact, even if much exposure is carried out by increasing the exposure time, the thickness of the hardened photoresist will not increase. Accordingly, there has been a problem in that a desired size of dot can not be obtained. Although the cause of this phenomenon has not been clarified, it is assumed that a reciprocity law failure phenomenon of the photosensitive resin and the close contact between the resin film and the inner surface of the faceplate are intricately related.

Nevertheless, it is difficult accurately to form a high-definition black matrix pattern by the conventional method. Also, the sensitivity and resolution of these photosensitive resins are not sufficient to form a high definition screen.

SUMMARY OF THE INVENTION

One object of this invention is to provide a method of forming a high-definition black matrix pattern.

Another object of this invention is to provide a photoresist composition which has good sensitivity and resolution for low illuminance exposure.

A further object of this invention is to provide an optimum photoresist composition to form a high definition black matrix pattern.

Therefore, the invention provides a method of forming a phosphor screen of a color picture tube comprising the steps of forming a photoresist film on an inner surface of a faceplate, exposing the photoresist film by a light from a light source through a shadow mask having a plurality of apertures, providing a light absorbing film on the photoresist film, and removing the hardened photoresist film by exposing and the light absorbing film on the hardened photoresist film using a peeling agent. The photoresist film is composed of at least a phosphate of a formalin condensation product of diazodiphenylamine, 2.5-bis(4'-azide-2'-sulphobenzilidene)cyclopentanone and its salts, polyvinylalcohol, and polyvinylpyrrolidone.

Also, the invention provides a photoresist composition composed of at least a phosphate of a formalin condensation product of diazodiphenylamine, 2.5-bis(4'-azide-2'-sulphobenzilidene)cyclopentanone and it salts, polyvinylalcohol, and polyvinylpyrrolidone.

DETAILED DESCRIPTION OF THE EMBODIMENT

Figure 1:
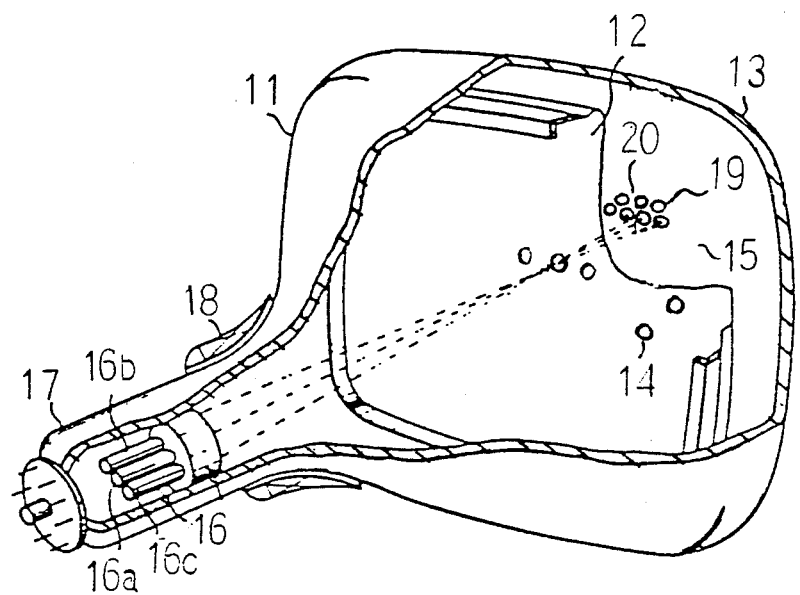
FIG. 1 shows a perspective view of a color picture tube which has a phosphor screen produced in accordance with this invention.

The inventor, in order to improve the sensitivity and adhesiveness of the photoresist, has proposed a photoresist composition composed of a mixture of the photoresist composition shown in U.S. Pat. No. 3,917,794, which was previously stated in the specification, with a diazo compound and polyvinylalcohol as shown in U.S. Pat. No. 4,491,629 and Japanese Laid-Open Patent Application Nos. Sho. 58-143338, 58-143339, 58-143340, and Sho. 60-203933. It has been proposed that a photoresist composition shown in Japanese Patent Publication No. Sho. 58-57094 composed of 2.5-bis(4'-azide-2'-sulphobenzilidene)cyclopentanone and its salt compounds as an azide compound which has higher sensitivity than the sodium salt of 4.4'-bisazidestilbene-2.2'-disulphonic acid. Both kinds of the above photoresist compositions have improved the sensitivity under conditions of low illuminance exposure, but there is still the problem of resolution in low illuminance exposure. That is to say, since the thickness of the remaining light-hardened resist was still thin due to the low illuminance exposure, partial pinholes occured in the pattern edge portions. Consequently, when the graphite film was peeled there was still the problem of poor resolution of the edge portions due to the lack of an underlying resist.

The inventor herein discovered a photoresist compound with a high resolution under low illuminance exposure. This compound is a combination of specific diazo and azide compounds. Namely, for the conventional photoresist composition used for a black matrix, a sodium salt of 4.4'-bisazidestilbene-2.2'disulphonic acid may be used as a cross-linking agent, as shown in U.S. Pat. No. 3,917,794. After that, as shown in Japanese Patent Publication No. Sho 48-57094, a sodium salt of 2.5-bis (4'-azide-2'-sulphobenzilidene) cyclopentanone may be used as a cross-linking agent in order to improve sensitivity of the photoresist composition. However, it is difficult for any of the above photoresist compositions to be applied in the high-definition phosphor screen because of the lower sensitivity under the condition of low illuminance exposure.

The present inventor has found a photoresist composition with good sensitivity and sufficient resolution, which is a mixture of sodium salt of 2.5-bis(4'-azide-2'-sulphobenzilidene)cyclopentanone and a phosphate of a formalin condensation product of diazodiphenylamine as a cross-linking agent. It is assumed that the reason for the good sensitivity and sufficient resolution under low illuminance exposure of the photoresist composition according to the invention is an increased light absorbing efficiency of the photoresist composition. This is based on the experimental fact that the photoresist film with a sufficient thickness may be obtained under low illuminance exposure by using the photoresist composition according to the invention. The spectral sensitivity of the conventional photoresist composition including sodium salt of 4.4'-bisazidestlbene-2.2'-disulphonic acid as a cross-linking agent has a peak sensitivity at about 335 nm and, the sensitivity region of the photoresist composition exists at the range of 220 to 430 nm. In addition, the spectral sensitivity of another conventional photoresist composition including sodium salt of 2.5-bis(4'-azide-2'-sulphobenzilidene)cyclopentanone, as a cross-linking agent, with improved sensitivity compared with the previous, photoresist composition has a peak at about 370 nm and the sensitivity region of the photoresist composition exists at the range of 250 to 460 nm. Meanwhile, the spectral sensitivity of the photoresist composition according to the invention has a peak at about 385 nm and the sensitivity region exists at the range of 200 to 550 nm. As is well known, a mercury discharge lamp used for a light source radiates light with a radiation peak at 365 nm and 435 nm wave length. Consequently, it is understood that the photoresist composition of this invention has good resolution under low illuminance exposure, because the peak sensitivity of the photoresist composition is closer to the peak radiation of the light source compared with the conventional photoresist composition. The photoresist composition of this invention may be applicable when the conditions of exposure illuminance are less than 0.3 $mW/cm^2$, preferably, 0.3 $mW/cm^2$ to 0.005 $mW/cm^2$. Since this photoresist composition has improved sensitivity and resolution under low illuminance exposure, it can be used for forming black matrix patterns with high definition.

With reference to the drawings, an embodiment of this invention is explained.

As seen from FIG. 1, the color picture tube according to this invention comprises a funnel 11, a face plate 12 formed on the front side of the funnel 11, an shadow mask 13 with round apertures 14 which is disposed inside of the face plate 12 so as to closely face a phosphor screen 15 coated on an inner surface of the face plate 12, and an in-line electron gun 16 received in the neck 17 and having three linearly arranged electron guns 16a, 16b, and 16c to emit three electron beams. A deflection coil 18 is mounted on the funnel. A phosphor screen 15 comprises a black matrix 19 and a trio of phosphor dots 20 which emit red, green, and blue lights. The black matrix 19 is constructed in the following manner. First, 50 parts by weight of polyvinylpyrrolidone sold under the name of K-90 (trade name of GAF Co), 12.5 parts by weight of polyvinylalcohol sold under the name of EG-40 (trade name of Nippon Gosei Co, Ltd), 5 parts by weight of 2.5-bis(4'-azide-2'-sulphobenzilidene) cyclopentanone Na and 0.5 part by weight of the phosphate of the formalin condensation product of diazodiphenylamine are dissolved in 4000 parts by weight of water. The photoresist liquid is prepared by adding 5 parts by weight of the dehydrated condensation product of γ-aminopropyltrihydroxysilane (a silane coupling agent manufactured by Nippon Unika with the trade name A-1106) as an adhesion accelerator.

Then, after the photoresist resin liquid is coated on the inner surface of the faceplate of a 14-inch color picture tube, it is dried and a photoresist film of thickness 0.6 μm is formed. Next, the photoresist film is exposed via a shadow mask with a mask hole diameter of 0.09 mm and mask hole pitch of 0.2 mm. The illuminance of the light source at this time is 0.13 $mw/cm^2$ at the inner surface of the faceplate panel, and the exposure time is 20 seconds. Exposing light comes out from the mercury discharge lamp light source through a window having a square shape with 1 mm width. The light is substantially equivalent to the light coming out from the window of a round aperture with diameter of 1 mm. In accordance with the size of the screen, the light source with a diameter of 0.5 to 2.0 mm may be used. After warm water developing, a graphite slurry is coated onto the inner surface of the faceplate, and then a graphite film is formed by drying. Next, after the faceplate has been immersed in 15% aqueous solution of sulphaminic acid for approximately 60 seconds, it is sprayed with warm water. Thus, a good black matrix with a hole diameter of 80 μm is formed over the entire surface of the panel.

Incidentally, as comparative examples, the photoresist liquids in Table 1 were prepared and the results of similar testing are shown in Table 2.

TABLE 1

| Comparative Example 1 | |
|---|---|
| Polyvinylpyrrolidone | 12 g |
| 4.4′-bisazidestilbene-2.2′-disulphonic acid Na | 1 g |
| N—β(aminoethyl)γ-aminopropyltrimethoxysilane | 2 g |
| water | 500 g |
| Comparative Example 2 | |
| Polyvinylpyrroliden | 12 g |
| 2.5′-bis(4′-azide-2′sulphobenzilidene) cyclopentanone Na | 1 g |
| N—β aminoethyl)γ-aminopropyltrimethoxysilane | 2 g |
| water | 500 g |
| Comparative Example 3 | |
| Polyvinylpyrrolidone | 36 g |
| Polyvinylalcohol | 9 g |
| 4.4′-bisazidestilbene-2.2′-disulphonic acid Na | 3 g |
| Phosphate of formalin condensate of diazodiphenylamine | 0.3 g |
| Dehydrated condensation product of γ-aminopropyltrihydroxysilane | 4 g |
| Water | 2200 g |

TABLE 2

| | This Invention | Comparative Example 1 | Comparative Example 2 | Comparative Example 3 |
|---|---|---|---|---|
| Exposure time to obtain specified size | 20″ | Could not be formed | 60″ | 32″ |

Also, at this time, the hole shapes of the black matrices are compared. The results are shown in Table 3.

TABLE 3

| | This Invention | Comparative Example 1 | Comparative Example 2 | Comparative Example 3 |
|---|---|---|---|---|
| Circularity of hole shape | 5μ or less | — | 10–15μ | 5–10μ |

Figure 2:
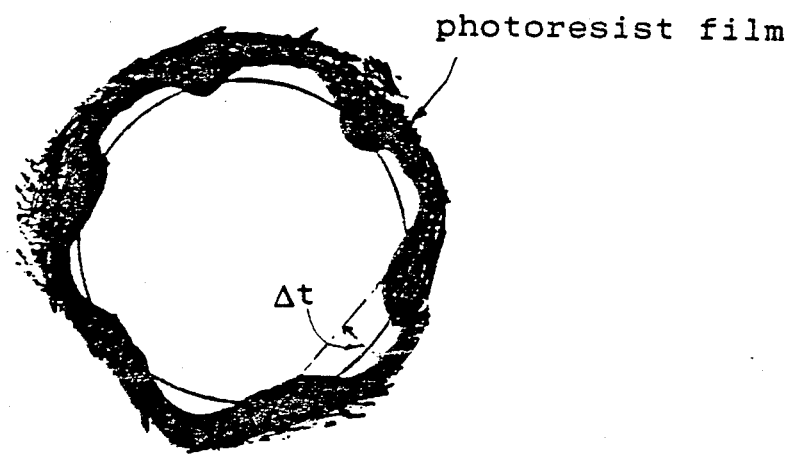
FIG. 2 is a diagram to illustrate the circularity of the shapes of the apertures in the black matrix.

As shown in FIG. 2, the circularity of the hole shapes was evaluated by the values of Δt. Furthermore, since the values of Δt were large over the entire panel surface in the case of Comparative Example 2, randomness was observed in the external appearance of the black matrix. Incidentally, the cause of this phenomenon is not clear, but it seems to be the following. Even in the case of the resist in Comparative Example 2, in low illuminance exposure, the thickness of the photoresist pattern after development becomes thin due to the effect of reciprocity law failure (reduction of sensitivity). Since the photoresist pattern was dried more firmly during the drying of the subsequent slurry coating of black matrix, even though a peeling agent was contacted with it, partial brittleness of the resist pattern did not occur. It is considered that this absence of partial brittleness led to poor hole shapes.

Table 4 shows the exposure times of the photoresist films for obtaining the specified size of black matrix using a linear light source lamp with an illuminance of 1.7 mW/cm$^2$ at the panel inner surface via a shadow mask with a mask pitch of 0.6 mm for a 14-inch stripe type color picture tube.

TABLE 4

| | This Invention | Comparative Example 1 | Comparative Example 2 | Comparative Example 3 |
|---|---|---|---|---|
| Exposure time to obtain specified size | 2″ | 4.8″ | 3.2″ | 3.2″ |

Moreover, at this time, the hole shapes of the black matrices were compared in the same way as above. The results are shown in Table 5.

TABLE 5

| | This Invention | Comparative Example 1 | Comparative Example 2 | Comparative Example 3 |
|---|---|---|---|---|
| Circularity of hole shape | 5μ or less | 5μ or less | 5μ or less | 5μ or less |

Incidentally, in the photoresist composition of this invention, the ratio of the phosphate of the formalin condensation product of diazodiphenylamine as the bridging agent and the 2.5-bis(4′-azide-2′-sulphobenzilidene)cyclopentanone and its salts is limited to a very narrow range of weight ratios of 1:5 to 1:15, and preferably 1:7 to 1:13. That is to say, by limiting the ratio to the above range, a photoresist composition with high sensitivity and high resolution during low illuminance exposure can be obtained. At less than 1:7, a tendency for hole linking is apparent in the black matrix, and if 1:13 is exceeded, neither the desired sensitivity nor resolution characteristics can be obtained. Also, as a water-soluble resin, the ratio of polyvinylalcohol and polyvinyl-pyrrolidone is limited to narrow range of weight ratios of 1:1 to 1:8, and preferably 1:2 to 1:6. At ratios of less than 1:2, the resolution will be reduced, and if the ratios of 1:6 is exceeded, the resolution will be poor, since adhesion will be reduced in the low illuminance exposure.

If this invention is used as described above, particularly when forming the phosphor screen of a high-definition color picture tube using a low illuminance light source, it is possible to make the exposure time shorter than in the past and, at the same time, to form a highly accurate pattern.

What is claimed is:
1. A method for forming a light absorbing pattern on a phosphor screen of a color picture tube comprising the steps of:
forming a solution containing at least a phosphate of a formalin condensation product of diazodiphenylamine, an adhesion accelerating amount of a silane coupling agent, 2,5-bis(4′-azide-2′-sulphobenzilidene)cyclopentanone and its salts, polyvinylalcohol, and polyvinylpyrrolidone, the ratio of the phosphate of the formalin condensation product of diazodiphenylamine to the 2.5-bis(4′a-zide-2′-sulphobenzilidene)cyclopentanone and its salts being within the range of about 1:5 to 1:15 by weight and the ratio of the polyvinylalcohol to polyvinylpyrrolidone being within the range of about 1:1 to about 1:8 by weight, coating a layer of the solution on an inner surface of a picture tube faceplate to form a photosensitive film;

exposing predetermine portions of the photoresist film to light from a light source through a shadow mask having a plurality of apertures therein to harden the portions;

coating the surface of the photoresist film with a light absorbing film; and removing the hardened portions of the photoresist film and the overlying parts of the light absorbing film on the hardened portions.

2. The method for forming a light absorbing pattern on a phosphor screen of a color picture tube according to claim 1, wherein the step of exposing includes the step of generating sufficient illuminance from the light source to provide an illuminance of about 0.005 mW/cm$^2$ to about 0.3 mW/cm$^2$ at the surface of the predetermined portions.

3. The method for forming a light absorbing pattern on a phosphor screen of a color picture tube according to claim 1, wherein the ratio of the phosphate of the formalin condensation product of diazodiphenylamine to the 2.5-bis(4'-azide-2'-sulphobenzilidene)cyclopentanone and its salts is within the range of about 1:7 to 1:13 by weight and the ratio of the polyvinylalcohol to polyvinylpyrrolidone is within the range of about 1:2 to about 1:6 by weight.

* * * * *